(12) United States Patent
Tendulkar

(10) Patent No.: US 9,276,210 B1
(45) Date of Patent: Mar. 1, 2016

(54) CONDUCTIVE BARRIERS FOR TERNARY NITRIDE THIN-FILM RESISTORS

(71) Applicants: Intermolecular Inc., San Jose, CA (US); Kabushiki Kaisha Toshiba, Tokyo (JP); SanDisk 3D LLC, Milpitas, CA (US)

(72) Inventor: Mihir Tendulkar, Mountain View, CA (US)

(73) Assignees: Intermolecular, Inc., San Jose, CA (US); Kabushiki Kaisha Toshiba, Tokyo (JP); SanDisk 3D LLC, Milpitas, CA (US)

(*) Notice: Subject to any disclaimer, the term of this patent is extended or adjusted under 35 U.S.C. 154(b) by 0 days.

(21) Appl. No.: 14/561,212

(22) Filed: Dec. 4, 2014

(51) Int. Cl.
*H01L 45/00* (2006.01)
*H01L 27/00* (2006.01)

(52) U.S. Cl.
CPC ............ *H01L 45/145* (2013.01); *H01L 45/126* (2013.01); *H01L 45/1608* (2013.01)

(58) Field of Classification Search
CPC . H01L 45/145; H01L 45/1608; H01L 45/126; H01L 45/146; H01L 45/08; H01L 45/12; H01L 45/1233; H01L 27/2409; H01L 27/246; H01L 27/2481; H01L 27/2418; H01L 27/2427
See application file for complete search history.

(56) References Cited

U.S. PATENT DOCUMENTS

| | | | |
|---|---|---|---|
| 5,776,823 A | 7/1998 | Agnello | |
| 6,900,498 B2 | 5/2005 | Stauf | |
| 6,965,137 B2* | 11/2005 | Kinney | G11C 11/5685 257/295 |
| 8,034,683 B2* | 10/2011 | Cho | C23C 16/305 257/E21.257 |
| 8,168,479 B2* | 5/2012 | Ha | G11C 13/0004 257/2 |
| 8,391,049 B2 | 3/2013 | Jo | |
| 8,435,831 B2 | 5/2013 | Sekar | |
| 8,890,106 B2* | 11/2014 | Yang | H01L 21/77 257/2 |
| 2013/0028003 A1 | 1/2013 | Wang | |

OTHER PUBLICATIONS

Jani Hamalainen et al.; Atomic Layer Deposition of Noble Metals and Their Oxides; Jan. 1, 2013; Department of Chemistry University of Helsinki, Finland; Unknown.

Yong Ju Lee et al.; Atomic Layer Deposition of Aluminum Thin Films Using an Alternating Supply of Trimethylaluminum and a Hydrogen Plasma; Aug. 6, 2002; The Electrochemical Society; Unknown.

* cited by examiner

*Primary Examiner* — Nikolay Yushin

(57) ABSTRACT

In a thin-film resistor stack (e.g. A ReRAM embedded resistor), a metallic barrier layer 1-5 nm thick protects an underlying or overlying ternary metal nitride layer from unwanted oxidation while having negligible effect on the resistance or height of the stack. For devices subjected to temperatures over 650 C after forming the stack, the metallic barrier layer may be iridium or ruthenium. For devices with temperatures kept below 650 C after forming the stack, the metallic barrier layer may be Al. The metallic barrier layer(s) and the ternary nitride layer may be formed in situ, for example by sputtering or atomic layer deposition.

17 Claims, 5 Drawing Sheets

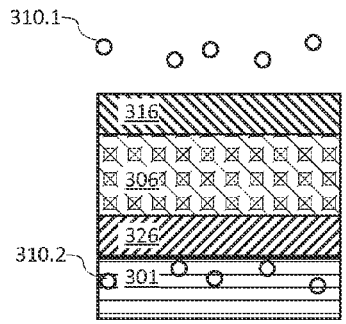
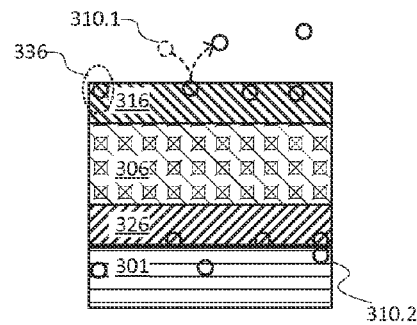
FIG. 3A
FIG. 3B
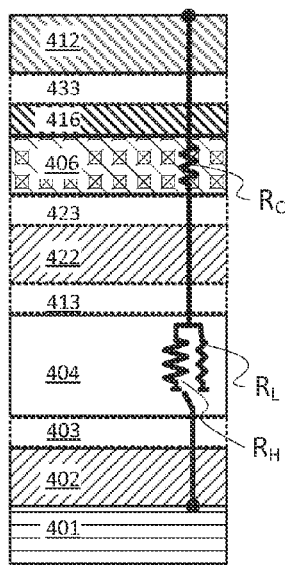
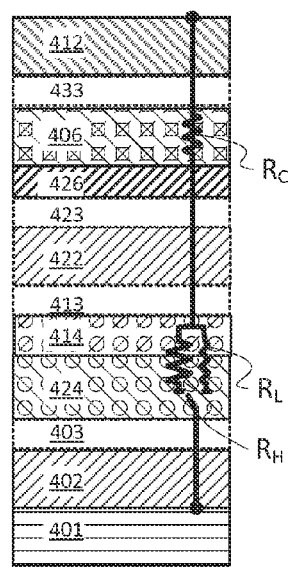
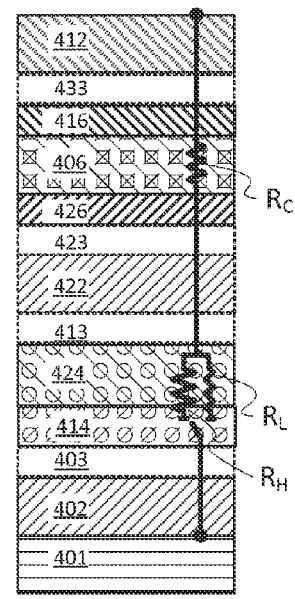
FIG. 4A
FIG. 4B
FIG. 4C

CONDUCTIVE BARRIERS FOR TERNARY NITRIDE THIN-FILM RESISTORS

BACKGROUND

Related fields include semiconductor devices and their fabrication; in particular, thin-film components included in individual cells of non-volatile memory based on resistive switching (ReRAM).

Nonvolatile memory elements are used in computers and other devices requiring persistent data storage (e.g., cameras, music players). Some traditional nonvolatile memory technologies (e.g., EEPROM, NAND flash) have proven difficult to scale down to smaller or higher-density configurations. Therefore, a need has developed for alternative nonvolatile memory technologies that can be scaled down successfully in terms of performance, reliability, and cost.

In resistive-switching-based nonvolatile memory, each individual cell includes a resistor that is bistable; it can be put into either of two states (a low-resistance state LRS or a high-resistance state HRS), and will stay in that state until receiving the input that changes it to the other state. The state of the bistable memory cell represents a bit value (e.g., the LRS may represent "1" and the HRS may represent "0"). The cell is thus "written" to by changing its resistance value. The cell is "read" by measuring its resistance in a way that does not change it. Ideally, write and read operations should require as little power as possible, both to conserve energy and to avoid generating unwanted heat.

Repeatability of the resistance values of "0" and "1" from cycle to cycle, as well as consistency of these values from cell to cell, can affect the power required to operate the cell. The larger the "error bars" around the LRS and HRS, the more different they need to be in order to be reliably read even in the worst case of expected error, which can often mean more power used for writing the cell.

SUMMARY

The following summary presents some concepts in a simplified form as an introduction to the detailed description that follows. It does not necessarily identify key or critical elements and is not intended to reflect a scope of invention.

Embodiments of a thin-film resistor may include a substrate; a first layer (a ternary nitride layer) over the substrate; and a second layer (a first metallic barrier layer) in contact with the ternary nitride layer. The ternary nitride layer, 0.5-5 nm thick, may include a transition metal, an additional element, and nitrogen, but contain less than 0.1 atomic percent (at %) oxygen. The first metallic barrier layer may include one of metallic aluminum (Al), metallic iridium (Ir), or metallic ruthenium (Ru). The metallic barrier layer, which may be 1-5 nm thick, may separate the ternary nitride layer from neighboring structures containing oxygen that would otherwise oxidize the ternary nitride layer. The metallic barrier layer may contain 0.1-10 at % absorbed oxygen concentrated near the interface farthest from the ternary nitride layer.

Optionally, the device may also include a second metallic barrier layer in contact with the ternary nitride layer on the opposite side from the first metallic barrier. The second metallic barrier may include metallic Al, metallic Ir, or metallic Ru, and the ternary nitride layer may be between the first metallic barrier layer and the second metallic barrier layer. Optionally, the first metallic barrier layer and the second metallic barrier layer may have the same chemical composition within 2 at %. Optionally, the thickness of the second metallic barrier layer may be 1-5 nm, and (e.g., due to absorbing oxygen that would otherwise have oxidized the ternary nitride layer) the atomic % of oxygen in the second metallic barrier layer may be greater than 0.001, concentrated on the interface of the metallic barrier layer farthest from the ternary nitride layer.

Embodiments of a method for fabricating a thin-film resistor may include forming a first layer (a ternary nitride layer) on a substrate and forming a second layer (a first metallic barrier layer) on the ternary nitride layer. The ternary nitride layer may include a transition metal, an additional element, and nitrogen, and the first metallic barrier layer may include one of metallic Al, metallic Ir, or metallic Ru and may have a thickness between 1 nm and 5 nm. Optionally, the method may also include annealing the substrate at a temperature less than or equal to 650 C if the first metallic barrier layer includes aluminum. Optionally, the method may also include the annealing of the substrate at a temperature greater than 650 C if the first metallic barrier layer includes iridium or ruthenium. Optionally, the forming of the ternary nitride layer and the forming of the first metallic barrier layer may be done in-situ without an intervening vacuum break. Optionally, the method may also include forming a second metallic barrier layer including the metallic Al, metallic Ir, or metallic Ru, with the ternary nitride layer sandwiched between the first metallic barrier layer and the second metallic barrier layer.

Embodiments of a ReRAM cell may include a substrate; a constant-resistance stack (e.g. a thin-film resistor) over the substrate including a first layer (e.g. a ternary nitride layer), a second layer (e.g. Al, Ir or Ru) contacting the ternary nitride on one interface, and optionally a third layer (e.g. metallic Al, metallic Ir, or metallic Ru) contacting the ternary nitride layer on an opposing interface; a fourth layer (e.g. a first electrode) between the constant-resistance stack and the substrate; a fifth layer (e.g. a second electrode) over the thin-film resistor; and a variable-resistance stack (e.g. a resistive switching element) between the first electrode and the second electrode.

Optionally, the ternary nitride layer may have a thickness between 0.5 nm and 5 nm. Optionally, the device may also include an oxide layer, and the first metallic barrier layer may be between the oxide layer and the ternary nitride layer. Optionally, the ternary nitride layer may be between the substrate and the first metallic barrier layer. Optionally, the device may also include a second metallic barrier layer including metallic Al, metallic Ir, or metallic Ru, with the ternary nitride layer between the first metallic barrier layer and the second metallic barrier layer. Optionally, the device may also include an intermediate electrode between the thin-film resistor and the resistive switching element. In some embodiments, the resistive switching element may include a variable-resistance layer and a defect reservoir layer, and the defect reservoir layer may have higher ionicity than the variable-resistance layer.

Embodiments of methods for fabricating the ReRAM cell may include preparing a substrate; forming a fourth layer (a first electrode) over the substrate; and forming a variable-resistance stack (a resistive switching element) over the first electrode. Optionally, the method may also include forming an eighth layer (an intermediate electrode) over the resistive switching element; forming a constant-resistance stack (a thin-film resistor) over the resistive switching element or, if present, the intermediate electrode; forming a fifth layer (a second electrode) over the thin-film resistor. In some embodiments, the method may include forming one of more additional layers (intervening layers). The intervening layers may be formed before forming the resistive switching element, before forming the intermediate electrode, or before forming the thin-film resistor.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIGS. 3A and 3B conceptually illustrate protection of a ternary nitride layer by metallic barrier layers.

FIGS. 4A-C conceptually illustrate ReRAM cells incorporating embedded resistors with metallic barrier layers.

DETAILED DESCRIPTION OF EXAMPLE EMBODIMENTS

Figure 1:
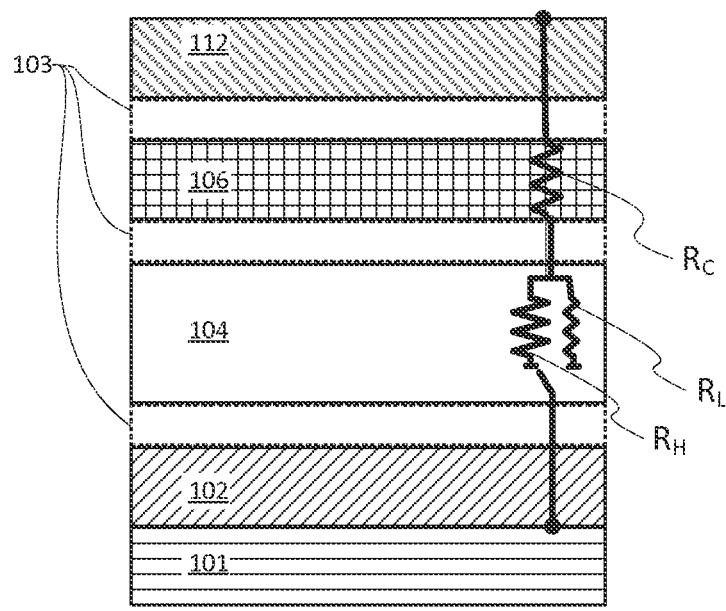
FIG. 1 is a simplified block diagram of a resistive-switching non-volatile memory cell.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

"A," "an," and singular nouns: May include plural variations, e.g., "a layer" may mean "one or more layers."

"About" or "approximately": Within ±10% variation.

"Above" and "over": Either directly contacting or separated by intervening elements; may conform to an underlying 3D structure.

"Amorphous": Exhibits less than 30% crystallinity as measured by a technique such as x-ray diffraction (XRD).

"Between" (range of values): Both boundary values and any value between the boundaries can be within the scope.

"Chemical vapor deposition": Depositing a film on a substrate from one or more vapor-phase chemical precursors that may be assisted to react by, e.g., heating the substrate.

"Concentrated" (at an interface): Having at least 10× the concentration or density at that interface than in another part of the structure.

"Conductive": Resistivity <1e-5 Ω·m at the intended operating temperature.

"Constant resistance" (in a ReRAM embedded resistor layer): Resistance that remains approximately constant (e.g., ±25%) in response to either "read" or "write" signals.

"Crystalline": Exhibits at least 30% crystallinity as measured by a technique such as x-ray diffraction (XRD).

"Dose": For a gas (e.g., a precursor) or plasma, the product of pressure (P) in torr and time (t) in seconds; For light, the product of intensity (I) in $W/cm^2$, averaged over the irradiated area, and time (t) in seconds.

"Film" and "layer": Interchangeably describe a portion of a stack; may include multiple sub-layers (e.g., a nanolaminate).

"First," "second," and other ordinals: For differentiation only, rather than imposing any specific spatial or temporal order.

"High-k material," "high-k layer," "high-k dielectric" (interchangeable): A material or layer with a dielectric constant ("k") greater than 9.

"Identical" (composition of compound): Within ±10 atomic %.

"In situ": Without an intervening vacuum break or other exposure to an uncontrolled environment; in the same process chamber as a previous process, or in another chamber with vacuum access to the chamber used for the previous process (e.g., in a multi-cha "Insulating" or "dielectric": Resistivity >1e8 Ω·m at the intended operating temperature.

"Ionic" (material): At least 55% of the bonds in the material are ionic.

"Metal nitride": Comprising nitrogen and one or more metals or semiconductors.

"Monolayer": A single layer of atoms or molecules covering a surface, with substantially all available bonding sites satisfied and substantially all individual members of the adsorbed species in direct physical contact with the underlying surface.

"Near-stoichiometric": Within ±10% of stoichiometric.

"On": Directly contacting; may conform to an underlying 3D structure.

"Operable" (for a specific purpose): Would satisfactorily fulfill that purpose given suitable connections, signals, or other external conditions.

"Or" in a list: Any, all, or any subset of list may be used.

"Oxide" (of an element): May include additional components besides the element and oxygen, including but not limited to a dopant or alloy.

"Precursor": A solid, liquid or vapor phase chemical having a species of interest for deposition on a substrate surface.

"Semiconducting": Resistivity between 1e-5 and 1e8 Ω·m at the intended operating temperature.

"Soak": injecting a gas into a chamber (e.g., an ALD chamber) and closing the inlets and exhausts (or, alternatively, adjusting them to keep a constant pressure within, e.g., ±10%) for a predetermined time (e.g., 0.5-10 minutes) while the gas interacts with substrates positioned within the chamber.

"Sub-monolayer" or "pre-wetting layer": Partial or incomplete monolayer; maximum thickness is one atom or molecule, but not all available bonding sites on the surface are covered, so that the average thickness is less than one atom or molecule.

"Sub-stoichiometric": Less than 90% stoichiometric (e.g., if $XO_2$ is stoichiometric, $XO_{1.8}$ and $XO_{1.5}$ are sub-stoichiometric.

"Substrate": A wafer or any other workpiece on which formation or treatment of material layers is desired. Non-limiting examples include silicon, germanium, silica, sapphire, zinc oxide, SiC, AlN, GaN, Spinel, silicon on oxide, silicon and carbide on oxide.

"Surface": Boundary between the ambient environment and a feature of the substrate.

"Vacuum": pressure less than about 0.1 Torr.

"Variable resistance" (in a ReRAM resistive-switching layer): Resistance that is reversibly switched between at least two stable states by "write" signals, but remains approximately constant in response to "read" signals.

FIG. 1 is a simplified block diagram of a resistive-switching non-volatile memory cell. This is a non-limiting example of an application that could make use of metal silicon nitrides with high Si content; other applications could also use them.

Substrate 101 may include additional layers and structures beneath the memory cell. Outer electrodes 102 and 112 are conductive layers that may form contacts with the word-lines and bit-lines that select a particular cell, within an array or group of other cells, to read or write. Variable-resistance (VR) layer (or stack) 104 reversibly, repeatably switches between at least two stable states (e.g., low-resistance state $R_L$ and high-resistance state $R_H$) in response to a "write" signal of an above-threshold energy transmitted through electrodes 102 or 112. For example, "write" signals may include a "set" signal that forms a conductive filament inside VR layer 104, producing the low-resistance state, and a "reset" signal that breaks, dissipates, or otherwise destroys the filament, returning the VR layer to the high-resistance state. In other types of memory, a write signal may change the phase, morphology, magnetic dipole, or some other electrical property of the VR layer or one or more of its interfaces. The "write" signal may be purely electrical, or may alternatively include a magnetic, thermal, or optical component. However, when a "read" signal is applied to sense the state of VR layer 104, its resistance does not change, generally because the "read" signal transfers only sub-threshold energy to the layer.

Optionally, a constant-resistance layer (or stack) 106, also known as an embedded resistor (ER) may be included in the cell to prevent excessive current from flowing through variable-resistance layer 104 or some other sensitive structure in the cell. For example, in cells that change resistive state by forming and breaking conductive filaments, excessive current in a "set" signal could potentially create a filament so wide or dense as to be unbreakable by a normal "reset" signal. This would effectively lock the cell permanently in its low-resistance state, incapable of being overwritten. To prevent this, ER 106 acts like a non-variable resistor connected in series with the variable-resistance switch of VR layer 104, maintaining a constant resistance $R_c$ (e.g., within ±25% or less) when either "read" or "write" signals are applied to the cell.

The VR layer may be about 1-100 nm thick, e.g., 2-20 nm or 5-10 nm. Thinner VR layers may be deposited using atomic layer deposition (ALD). Thicker VR layers may be deposited using ALD, chemical vapor deposition (CVD), or physical vapor deposition (PVD).

In addition, any number of intervening layers 103 may be formed between electrodes 102 and 112. Examples of intervening layers (or stacks) include barrier layers to prevent inter-layer reactions or diffusion of metals or oxygen; buffer layers; defect-access layers; doping layers; coupling layers; diodes or other current-steering components; intermediate electrodes; and others.

Electrodes may be made from conductive materials, such as n-doped polysilicon, p-doped polysilicon, titanium nitride, ruthenium, iridium, platinum, and tantalum nitride. Electrodes may be less than about 100 nm thick, less than about 50 nm thick, or even less than about 10 nm thick. Even thinner electrodes may be made by ALD. Either or both electrodes may be made of an inert material that does not react with neighboring layers.

In some embodiments, one of the electrodes may be made of a reactive material to act as a source, reservoir, or sink for defects in the variable resistance layer. Defects may travel through the interface between the reactive electrode and the VR layer during forming, set, or reset operations. For example, titanium nitride is an oxygen-scavenging material and can create oxygen vacancies in a neighboring oxide layer.

The VR layer may be fabricated from a dielectric material, such as a metal oxide material or other material that can be reversibly switched between two or more stable resistive states. In some embodiments, the VR layer is fabricated from a high bandgap material, e.g., a material that has a bandgap of at least about 4 electron volts (eV). Some examples of such materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The high bandgap materials may improve data retention in the ReRAM cell and reduce leakage current by trapping less charge than lower-bandgap materials. High bandgap materials also create a large barrier height for the mobile defects to cross during the read, set, and reset operations. Other suitable materials for the VR layer include titanium oxide ($TiO_x$), nickel oxide ($NiO_x$), cerium oxide ($CeO_x$), and semiconducting metal oxides (p-type or n-type), such as zinc oxides ($Zn_xO_y$), copper oxides ($Cu_xO_y$), and their nonstoichiometric and doped variants.

Some VR layers are stacks of two or more layers. The layers may be oxides, nitrides, or oxynitrides and may or may not share common metals or other elements. Some of the metals and other elements in the oxides, nitrides, or oxynitrides may include aluminum (Al), chromium (Cr), germanium (Ge), hafnium (Hf), lutetium (Lu), molybdenum (Mo), niobium (Nb), tantalum (Ta), titanium (Ti), tungsten (W), and zirconium (Zr). One or more interfaces in the stack may be between electrically dissimilar materials (e.g., high-k and low-k, high-ionicity and low-ionicity, near-stoichiometric and sub-stoichiometric, crystalline and amorphous, different grain sizes or lattice structures). For example, such an interface may provide a controlled weak point at which the filament will repeatably and consistently break.

Materials for the constant-resistance layer or embedded resistor include ternary nitrides, oxynitrides, oxides, or carbides. For example, the material may be a nitride, oxynitride, oxide, or carbide of a transition metal (e.g., Hf, Ir, Lu, Mo, Ta, W, or Zr) and an additional element. The additional element may be another transition metal (e.g., Ti), or a different type of material (e.g., Al, Si, B). Thicknesses may be, for example, 2-10 nm. Other characteristics such as sheet resistivity may depend on such factors as whether the embedded resistor is intended to break down during the forming operation or not.

It is believed that oxidation of the ER degrades ReRAM performance. Oxidation can occur during a vacuum break if the ER is exposed; during deposition of an overlying oxide layer or treatment of an overlying layer in an oxygen-containing ambient if the intervening layers are oxygen-permeable. Oxidation can also occur if oxygen migrates into the ER from an overlying or underlying layer, e.g., during annealing. Many ReRAM devices, for example, use selector diodes that require a rapid thermal process (e.g., 1 minute at 750 C) for activation. Other materials in the stack must also be able to withstand the heating without performance-degrading changes in electrical characteristics.

Figure 2A:
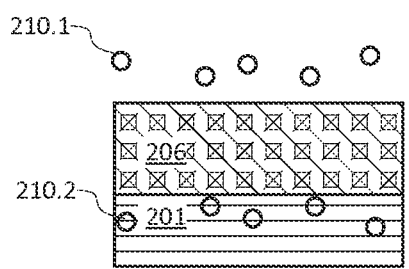
FIGS. 2A and 2B conceptually illustrate oxidation of a ternary nitride ER.
Figure 2B:
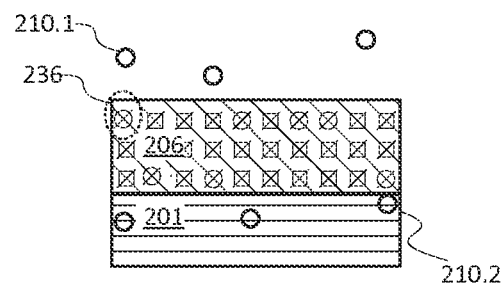

FIGS. 2A and 2B conceptually illustrate oxidation of a ternary nitride ER. Substrate 201 may include structures, such as electrodes, VR layers, interconnects, or other components located underneath ER 206. In FIG. 2A, the ternary nitride of ER 206 includes a transition metal (downward-slanting continuous lines "TM"; e.g., Mo, Ta, W), an additional element (upward-slanting broken lines "AE"; e.g., Si, B, Al, Er), and nitrogen (squares). Oxygen (circles) 210.1 may be part of an ambient gas or liquid. Oxygen 210.2 may be interstitially trapped or loosely bound in other layers of the stack. These other layers may have intentionally added oxygen (e.g., an oxide layer) or incidentally trapped oxygen (e.g., some metals such as Y and Ti, and their nitrides, tend to scavenge oxygen from their surroundings).

In FIG. 2B, some of the oxygen has penetrated the ternary nitride and converted it to an oxynitride 236. Now, instead of a ternary nitride [TM][AE]N, the ER is a n oxynitride [TM][AE]ON. Many of the ternary nitrides of interest for ERs can be oxidized to a depth of 5 nm, which becomes very significant when the layer thickness can be less than 20 nm, less than 10 nm, or even less than 5 nm.

FIGS. 3A and 3B conceptually illustrate protection of a ternary nitride layer by metallic barrier layers. In FIG. 3A, ternary nitride layer 306 is between metallic barrier layers 326 and 316. Substrate 201 may include structures, such as electrodes, VR layers, interconnects, or other components located underneath ER stack 326, 306, 316. Metallic barrier layers 326 and 316 may include, e.g., Al, Ir or Ru and be 0.5-5 nm thick. Like the unprotected ternary nitride layer 206 in FIG. 2A, the ER stack 326, 306, 316 may encounter oxygen 310.1 borne by ambient gas or liquid and/or oxygen 310.2 interstitially trapped or loosely bound in other layers of the stack.

In FIG. 3B, oxygen impinging on the metallic barrier layers 316, 326 is quickly absorbed near the outer interface, for example into local oxidized region 336. Because the metallic barrier layers have a very low diffusion coefficient for oxygen, the oxygen cannot penetrate into ternary metal nitride layer 306. The oxides formed at the outer interfaces of the metallic barrier layers have an even lower diffusion coefficient for oxygen, so that subsequent oxygen impinging on a local oxidized region is excluded.

Therefore, the metallic barrier layers 316, 326 protect ternary nitride layer 306 from oxidation without unacceptably compromising other properties of the stack. For example, because the metallic barrier layers are only 0.5-5 nm thick, they do not add unacceptable thickness to the stack. Because the material of the metallic barrier layers is highly conductive and any oxidation is confined to a thin and often non-contiguous "skin" on the outer interface, they do not appreciably change the resistance of the stack.

FIGS. 4A-C conceptually illustrate ReRAM cells incorporating embedded resistors with metallic barrier layers. All three figures show a substrate 401 (which may include underlying layers or structures omitted for clarity), a first electrode 402, a second electrode 412, an optional intermediate electrode 422, and optional intervening layers 403, 413, 423, and 433 which may be other barrier layers, buffer layers, doping layers, coupling layers, defect-access layers, or any other suitable type of layer. The three figures show different examples of resistive switching elements; FIG. 4A has a single VR layer, while FIGS. 4B and 4C have VR bi-layers 414, 424. These layers may be any of the types described with reference to FIG. 1 or any other suitable type of VR layer.

VR layers 404, 414, and 424 may be, for example, oxides or oxynitrides. In addition, electrodes 402, 412, and 422 may include materials, such as titanium nitride and some other metal nitrides, that are not intentionally made as oxides but may trap oxygen from other sources. These types of VR layers are non-limiting examples of neighboring structures (to the thin-film resistor) that contain oxygen. During annealing or other heat exposure, oxygen from these layers may diffuse toward the thin-film resistor and, if not blocked by a barrier layer, may convert some of the ternary nitride to oxynitride.

In FIG. 4A, ternary nitride layer 406 has a single metallic barrier layer 416 above it. This configuration might be used, for example, when there is little risk of oxidation from the layers under ternary nitride layer 406 (e.g., there is very little oxygen in those layers or it is very tightly bound), but a vacuum break, oxygen-containing treatment, or overlying layer is expected to expose ternary nitride layer 406 to oxygen.

In FIG. 4B, ternary nitride layer 406 has a single metallic barrier layer 426 below it. This configuration might be used, for example, when there is little risk of oxidation from ambient gas or liquid or from overlying layers, but the layers under ternary nitride layer 406 contain interstitial or loosely-bound oxygen.

In FIG. 4C, ternary nitride layer 406 has a first metallic barrier layer 416 above it and a second metallic barrier layer 426 below it. This configuration protects ternary nitride layer 406 from oxygen impinging from either above or below.

Figure 5:
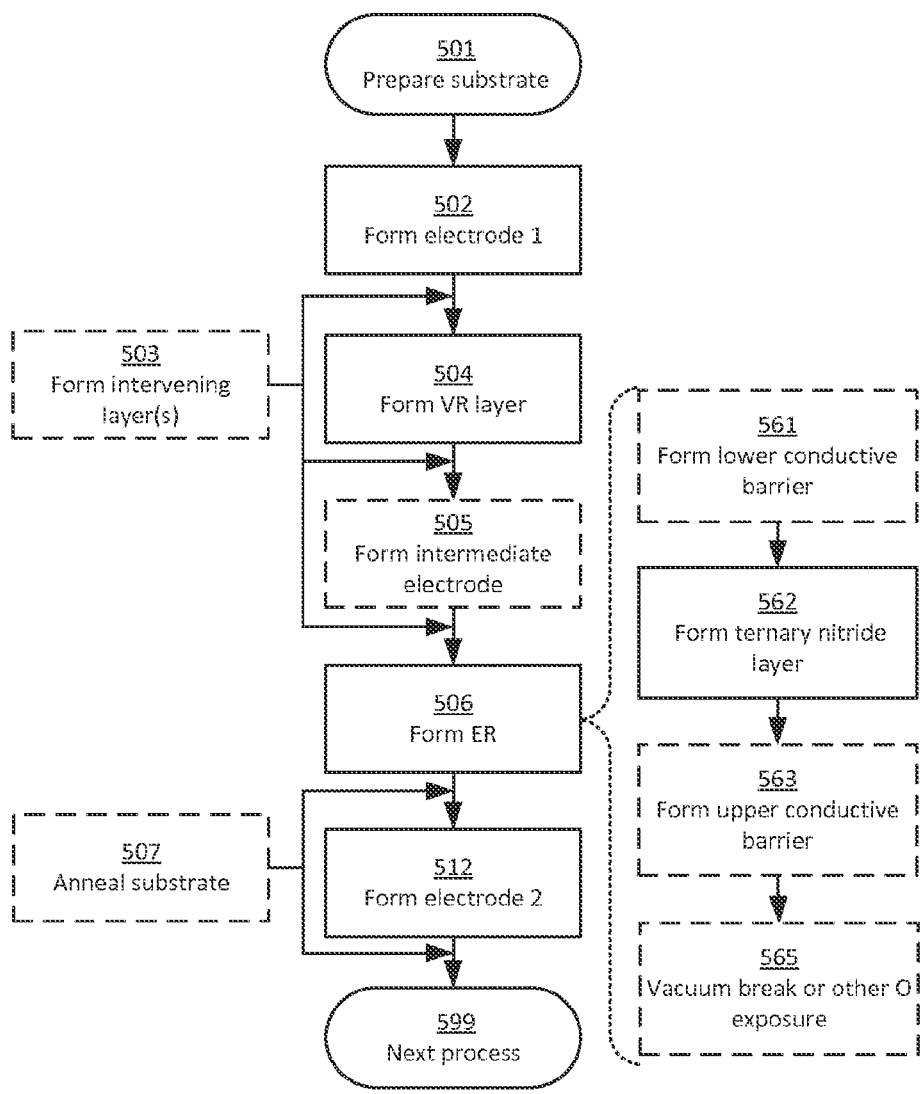
FIG. 5 is a flowchart of an example process for fabricating a ReRAM cell with a constant-resistance layer protected by one or more metallic barrier layers.

FIG. 5 is a flowchart of an example process for fabricating a ReRAM cell with a constant-resistance layer protected by one or more metallic barrier layers. Step 501 of preparing a substrate may include cleaning, degassing, other treatments, or the formation of layers and structures that precede those formed by this process. Step 502 of forming a first electrode over the substrate may include any suitable method for the selected material, which in some embodiments may include without limitation PVD, CVD, ALD, plasma-enhanced CVD or ALD, electrochemical deposition, or electroless deposition.

Step 504 of forming a resistive switching element over the first electrode may include forming a single layer or a stack of any of the variable-resistance materials previously described with reference to FIG. 1. Optional step 505 of forming an intermediate electrode over the resistive switching element may include the same method used for the first electrode, or any other suitable method for the selected material as described for forming the first electrode.

Step 506 of forming a thin-film resistor over the resistive switching element 504 (or, if present, on the intermediate electrode) may include step 562 of forming a ternary nitride layer. Ternary nitride layer formation 562 may be preceded by step 561 of forming an underlying metallic barrier layer, or followed by step 563 of forming an overlying metallic barrier layer, or both.

Optionally, underlying metallic barrier layer formation 561, ternary nitride layer formation 562, and overlying metallic barrier layer formation 563, or alternatively any subset of the three steps, may be done in-situ without an intervening vacuum break. Once the overlying metallic barrier layer formation 563 is complete, optional step 565 of subjecting the substrate to a vacuum break or other oxygen exposure may be done without oxidizing the ternary nitride layer under the overlying metallic barrier layer.

Step 512 of forming a second electrode over the thin-film resistor may include the same method used for the first electrode, or any other suitable method for the selected material as described for forming the first electrode. Optional step 503 of forming an intervening layer may be done before the resistive switching element formation 504, the intermediate electrode formation 505, or the thin-film resistor formation 506. Optional step 507 of annealing the substrate may be done at any point after thin-film resistor formation 506. for example, for metallic Al barrier layer(s) the annealing temperature may be less than 650 C, and for metallic Ir or metallic Ru barrier layer(s) the annealing temperature may be greater than 650 C. Afterward, the next process 599 may commence.

Figure 6:
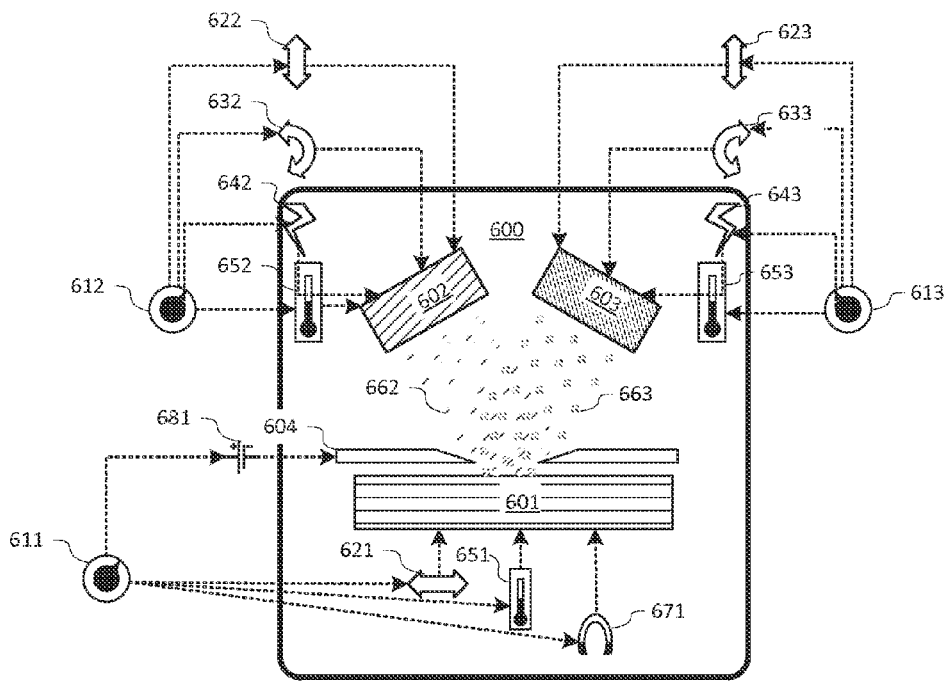
FIG. 6 is a block diagram of co-sputtering in an example physical vapor deposition (PVD) chamber.

FIG. 6 is a block diagram of co-sputtering in an example physical vapor deposition (PVD) chamber. In chamber 600, substrate 601 receives a first sputtered material 662 from a first target 602 and a second sputtered material 663 from a second target 603. A controller 612 may control one or more of position 622, angle 632, plasma power 642, and temperature 652 of target 602. A controller 613 may control one or more of position 623, angle 633, plasma power 643, and temperature 653 of target 603. Although the illustrated system shows two targets for simplicity, some embodiments may use more than two targets.

Controllers 612 and 613 for the separate targets may independently vary the respective targets' position, angle, plasma power, or temperature in real time as sputtering continues. Thus the separate targets can be sputtered at different plasma power levels or temperatures, or from different throw distances to the substrate, to vary the relative concentrations of each target material being deposited on the substrate. If at least one of the variables can be changed while sputtering continues, the composition of the film may be varied with depth if desired.

Some process chambers also have a controller 611 to vary the position 621, temperature 651, and local magnetic field 671 of substrate 601. Like the other controllers 612 and 613, controller 611 may be programmable, may be remote from the process chamber and operate via a wireless connection, and may be capable of varying the substrate's position, angle, plasma power, or temperature in real time as sputtering continues. "Position" in this block diagram is symbolized by a single two-headed arrow for simplicity, but it is intended to symbolize position variation in any or all directions. Some process chambers also have a mask 604 to block sputtered materials 662, 663 from reaching selected parts of substrate 601. Optionally, a controllable bias voltage 681 may be applied to mask 604. In process chambers equipped to change the relative position of substrate 601 and mask 604 during processing, different parts of substrate 601 may be sputtered with material having different proportions of first material 662 and second material 663.

This type of apparatus offers flexibility in changing the deposited material either in steps (by opening and closing shutters over targets, or turning power to targets on or off) or continuously (by changing the power, throw-distance, or angle of one or more targets independently).

Figure 7:
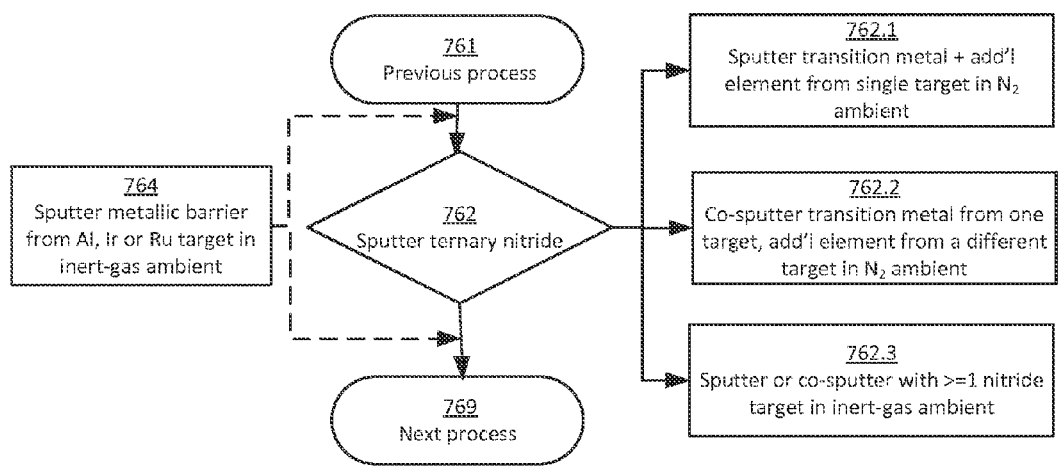
FIG. 7 is a flowchart of an example sputtering process for forming a ternary nitride constant-resistive layer protected by one or more metallic barrier layers.

FIG. 7 is a flowchart of an example sputtering process for forming a ternary nitride constant-resistive layer protected by one or more metallic barrier layers. After previous process 761 (e.g., formation of an underlying structure on a substrate) step 764 of sputtering a metallic barrier layer from an Al, Ir or Ru target may precede step 762 of sputtering the ternary nitride layer, follow it, or both. The metallic barrier layer sputtering 764 is generally done in an inert-gas ambient (e.g., a noble gas). Options for sputtering the ternary nitride layer include, without limitation, step 762.1 of sputtering both the transition metal and the additional element from a single compound target in an ambient including $N_2$, which will nitride the materials as they sputter. Another option is step 762.2 of co-sputtering a transition metal target and a separate additional element target in an ambient include $N_2$, An additional option is step 763.3 of sputtering or co-sputtering in an inert-gas ambient where one or more of the targets is already a nitride (e.g., a transition metal nitride or a nitride of the additional element). Afterward, next process 769 may commence.

Figure 8:
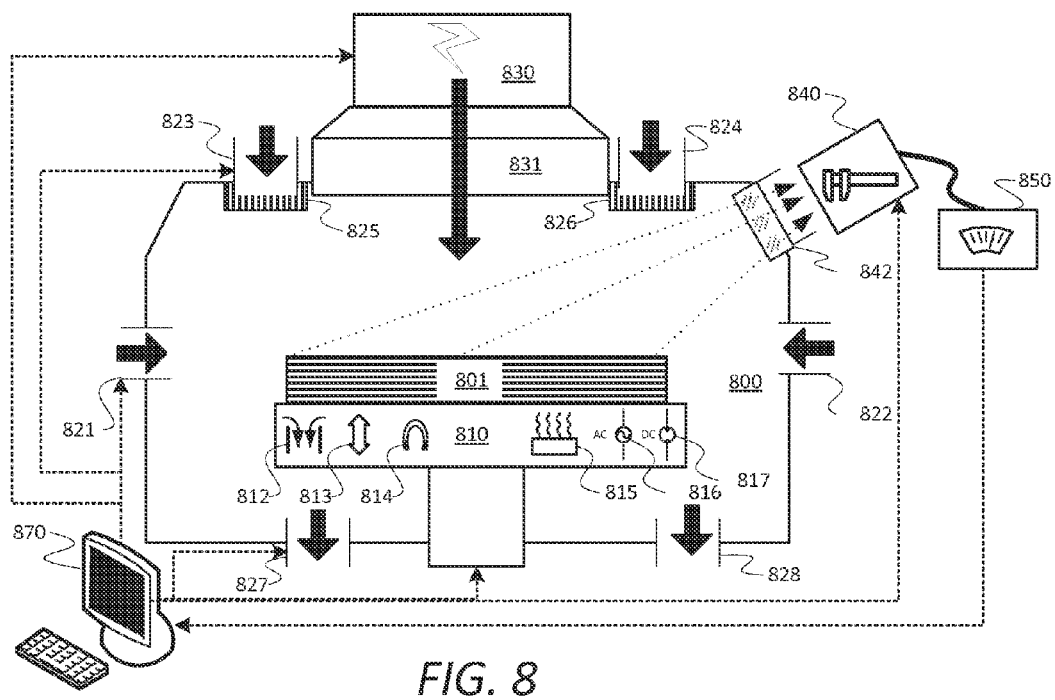
FIG. 8 is a block diagram of an example of a plasma-equipped atomic layer deposition (ALD) chamber.

FIG. 8 is a block diagram of an example of a plasma-equipped atomic layer deposition (ALD) chamber. Inside ALD chamber 800, substrate 801 is held by a substrate holder 810. Substrate holder 810 may be equipped with vacuum 812 (for example, a vacuum chuck to grip the substrate); motion 813 in any direction, which may include tilt and rotation; a magnetic field source 814; heater or temperature control 815; or sources of AC 816 or DC 817 bias voltage. Chamber 800 also has gas inlets 821, 822, 823, 824 for CVD precursors, buffer gases, and purge gases. Exhausts 827, 828 may be coupled to vacuum pumps to remove gases from chamber 800. Some of the inlets may feed through one or more diffusers or "showerheads" 825, 826. In some embodiments, remote plasma chamber 830 may generate reactive species, such as ions, that enter chamber 800 through input adapter 831. In some embodiments, a direct plasma may be generated at or near the surface of substrate 801. Measurement system 840 may monitor substrate 801 through measurement ports 842. The measurements from measurement system 840 may be collected by a monitoring system 850.

A plasma-equipped ALD chamber offers flexibility in depositing smooth, uniform coatings one monolayer (or sub-monolayer) at a time. Nanolaminates of alternating monolayers or small groups of monolayers of different materials may exhibit the electrical, thermal, or other properties of an intermixed compound of the different materials. Plasma treatments may be used, for example, to passivate remaining unsatisfied bonds on the surface.

Figure 9:
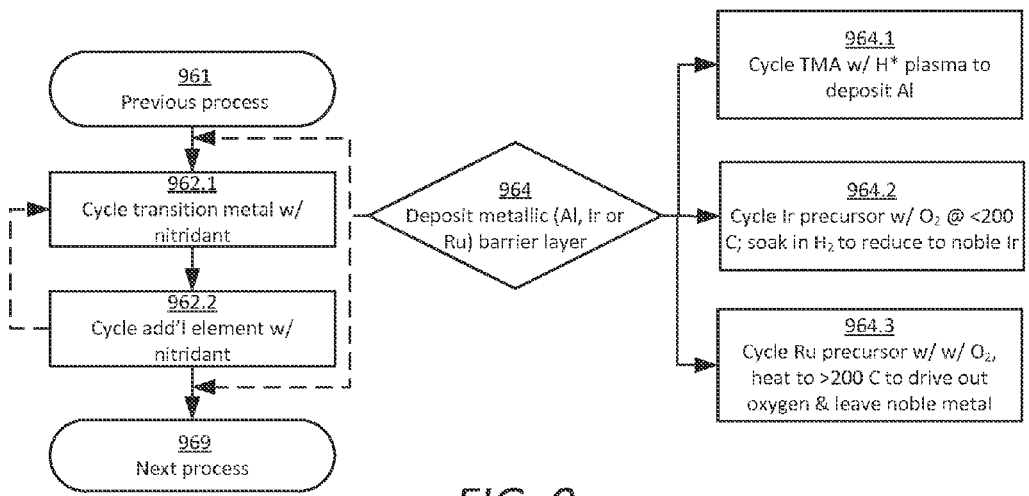
FIG. 9 is a flowchart of an example ALD process for forming a ternary nitride constant-resistive layer protected by one or more metallic barrier layers.

FIG. 9 is a flowchart of an example ALD process for forming a ternary nitride constant-resistive layer protected by one or more metallic barrier layers. Each ALD "cycle" includes exposing the substrate to a precursor for a material, purging the chamber, exposing the substrate to a reactant that reacts with the precursor to form a reacted monolayer (or sub-monolayer, for sub-saturation doses of precursor or reactant), and purging the chamber again.

After previous process 961, steps 962.1 of cycling the transition metal precursor with a first nitridant and 962.2 of cycling an additional element precursor with a second nitridant may each be done once or several times before proceeding to the next step. For example, one cycle of transition metal nitride may be followed by one cycle of additional element nitride; three cycles of transition metal nitride may be followed by five cycles of additional element nitride, or any other suitable pattern of alternating layers. The sequence of steps 962.1 and 962.2 may be repeated until a desired ternary nitride thickness is reached.

Before or after forming the ternary nitride layer, or both, step 964 of forming a metallic Al, metallic Ir or metallic Ru barrier layer may be performed. For example, a metallic Al barrier layer may be formed by step 964.1 of cycling an Al precursor such as trimethylaluminum (TMA) with hydrogen plasma. Alternatively, a metallic Ir barrier layer may be formed by step 964.2 of cycling an Ir precursor such as (methylcyclopentadienyl)iridium with $O_2$ at a temperature less than 200 C, then soaking in $H_2$ to reduce the oxide to metallic Ir. Alternatively, a metallic Ru barrier layer may be formed by step 964.3 of cycling a Ru precursor such as bis(N,N'-di-tert-butylacetamidinato)ruthenium(II)dicarbonyl with $O_2$ and heating the substrate to a temperature greater than 200 C to drive out the oxygen.

After forming the ternary nitride layer and one or two metallic barrier layers to make the ReRAM ER or other thin-film resistor, next process 969 may commence.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A device, comprising:
   a substrate;
   a first layer operable as a ternary nitride layer over the substrate; and
   a second layer operable as a first metallic barrier layer in contact with the first layer;
   wherein the first layer comprises the nitride of a transition metal and an additional element;
   wherein the second layer comprises one of metallic Al, metallic Ir, or metallic Ru; and
   wherein the first layer comprises less than 0.1 at % oxygen;
   wherein an atomic % of oxygen in the second layer is between 0.001 and 0.1; and
   wherein the oxygen in the second layer is concentrated at an interface of the second layer farthest from the first layer.

2. The device of claim 1, wherein a thickness of the second layer is between 1 nm and 5 nm.

3. The device of claim 1, further comprising a third layer operable as a second metallic barrier layer in contact with the first layer;
   wherein the third layer comprises metallic Al, metallic Ir, or metallic Ru; and
   wherein the first layer is between the second layer and the third layer.

4. The device of claim 3, wherein the second layer and the third layer have an identical chemical composition within 2 at %.

5. The device of claim 3, wherein a thickness of the third layer is between 1nm and 5 nm.

6. The device of claim 3, wherein an atomic % of oxygen in the third layer is greater than 0.001; and
   wherein the oxygen is concentrated at the interface of the third layer farthest from the first layer.

7. The device of claim 1, further comprising a neighboring structure containing oxygen; and
   wherein the second layer is between the first layer and the neighboring structure.

8. A device, comprising:
   a substrate;
   a constant-resistance stack operable as a thin-film resistor over a substrate;
   wherein the constant-resistance stack comprises a first layer in contact with a second layer;
   a third layer operable as a first electrode between the constant-resistance stack and the substrate;
   a fourth layer operable as a second electrode over the constant-resistance stack; and
   a variable-resistance stack operable as a resistive switching element between the third layer and the fourth layer;
   wherein the first layer comprises a transition metal, an additional element, and nitrogen; and
   wherein the second layer comprises one of metallic Al, metallic Ir, or metallic Ru and has a thickness between 1 nm and 5 nm.

9. The device of claim 8, wherein the first layer has the thickness between 0.5 nm and 5 nm.

10. The device of claim 8, further comprising an oxide layer; and
    wherein the second layer is between the oxide layer and the first layer.

11. The device of claim 8, wherein the first layer is between the substrate and the second layer.

12. The device of claim 8, further comprising a fifth layer operable as a second metallic barrier layer;
    wherein the fifth layer comprises metallic Al, metallic Ir, or metallic Ru; and
    wherein the first layer is between the second layer and the fifth layer.

13. The device of claim 8, further comprising a sixth layer operable as an intermediate electrode between the constant-resistance stack and the variable-resistance stack.

14. The device of claim 8, wherein the variable-resistance stack operable as a resistive switching element comprises a seventh layer operable as a variable-resistance layer and an eighth layer operable as a defect reservoir layer; and
    wherein the eighth layer has a higher ionicity than the seventh layer.

15. A method, comprising:
    forming a first layer over a substrate, wherein the first layer comprises a ternary nitride layer; and
    forming a second layer operable as a first metallic barrier layer on the first layer;
    annealing the substrate at a temperature less than or equal to 650 C;
    wherein the first layer comprises a transition metal, an additional element, and nitrogen; and
    wherein the second layer comprises metallic Al and has a thickness between 1 nm and 5 nm.

16. The method of claim 15, wherein the forming of the first layer and the forming of the second layer are done in-situ without an intervening vacuum break.

17. The method of claim 15, further comprising forming a third layer operable as a second metallic barrier layer;
    wherein the third layer comprises metallic Al, metallic Ir, or metallic Ru; and
    wherein the first layer is between the second and the third layer.

* * * * *